United States Patent [19]

Robinson et al.

[11] Patent Number: 4,869,767

[45] Date of Patent: Sep. 26, 1989

[54] PROCESS FOR PLACING SINGLE OR MULTIPLE PATTERNED LAYERS OF CONDUCTIVE MATERIAL ON A SUBSTRATE

[75] Inventors: Richard A. Robinson, Parkville; William E. Brown, Blue Springs, both of Mo.

[73] Assignee: Hallmark Cards, Incorporated, Kansas City, Mo.

[21] Appl. No.: 58,598

[22] Filed: Jun. 2, 1987

Related U.S. Application Data

[63] Continuation of Ser. No. 730,375, May 3, 1985, abandoned.

[51] Int. Cl.[4] .............................................. B32B 31/00
[52] U.S. Cl. ..................................... 156/233; 156/234; 156/235; 156/241; 156/249; 156/267; 156/275.7; 156/344
[58] Field of Search ............... 156/233, 234, 235, 241, 156/249, 267, 275.7, 344

[56] References Cited

U.S. PATENT DOCUMENTS

| | | | |
|---|---|---|---|
| Re. 30,274 | 3/1980 | Bolon et al. ........................ | 361/411 |
| 2,984,597 | 5/1961 | Hennes ................................ | 156/233 |
| 3,181,986 | 5/1965 | Pritkin ................................. | 156/233 |
| 3,240,647 | 3/1966 | Morgan ............................... | 156/233 |
| 3,589,962 | 6/1971 | Bonjour .............................. | 156/233 |
| 3,753,850 | 8/1973 | Brunet ................................ | 156/233 |

(List continued on next page.)

FOREIGN PATENT DOCUMENTS 0055282 5/1981 Japan .
1583544 1/1981 United Kingdom .

OTHER PUBLICATIONS

IBM Tech. Inc. Bull., Preparing Printed Circuits, Immendorter, vol. 4, No. 12, May, 1962.
J. Lyman, Surface Mounting, Electronics, Feb. 9, 1984, pp. 113–124.
New Trends, Circuits are Applied Directly to Electronic Packages, Machine Design, Feb. 7, 1985, p. 12.
S. Chin, Conformable Release Paper Aid and Fabrication of 3-D p.c. Boards, Outlook, Feb. 15, 1985, pp. 17 and 19.
J. Lyman, *Components for SMA Arrive*, Electronics Week, Apr. 8, 1985, pages 49 through 53.
What's News, *Revolutionary Advance in Circuit Printing*, Radio Electronics.
J. Lyman, *Surface Mounting*, Electronics, Feb. 9, 1984, pp. 113–124.
New Trends, Circuits Are Applied Directly to Electronic Packages, Machine Design, Feb. 7, 1985, page 12.
S. Chin, *Conformable Release Paper Aids Fabrication of 3-D pc Boards*, Outlook, Feb. 15, 1985, pages 17 and 19.

Primary Examiner—Ellis P. Robinson
Assistant Examiner—P. J. Ryan
Attorney, Agent, or Firm—Neuman, Williams, Anderson & Olson

[57] ABSTRACT

The invention consists of an improved method for placing single or multiple patterned layers of conductive material on a substrate. The method provided includes the step of placing or depositing a thin patterned layer of electrically conductive material on a substrate. The procedures used to deposit this layer include mechanically adhering the layer to the substrate then removing portions of it to form a pattern. They also include printing adhesive on the substrate and using it to peel a conductive pattern off of the surface of a transfer agent. After depositing the first conductive pattern, the process prints an insulating layer on top of it. The insulating layer has openings through which the next conductive pattern makes electrical contact with the first. Similarly, the process places other conductive layers and prints other insulating layers between them to produce multiple layers of conductive patterns. The multilayer circuit board provided includes a substrate. It also includes conductive layers separated by insulating layers and electrically interconnected through openings in those insulating layers.

14 Claims, 5 Drawing Sheets

U.S. PATENT DOCUMENTS

| | | | |
|---|---|---|---|
| 3,956,091 | 5/1976 | Polichette et al. | 156/3 |
| 3,957,694 | 5/1976 | Bolon et al. | 252/514 |
| 3,959,523 | 5/1976 | Grunwald et al. | 427/98 |
| 3,968,372 | 7/1976 | Laughinghouse | 250/402 |
| 3,984,598 | 10/1976 | Sarazin et al. | 156/233 |
| 3,990,926 | 11/1976 | Konicek | 156/233 |
| 4,012,552 | 3/1977 | Watts | 428/200 |
| 4,049,844 | 9/1977 | Bolon et al. | 427/54 |
| 4,113,424 | 9/1978 | Armstrong et al. | 431/95 |
| 4,115,703 | 9/1978 | Dobras | 250/568 |
| 4,149,219 | 4/1979 | Kraft | 361/386 |
| 4,200,901 | 4/1980 | Shaffer et al. | 362/5 |
| 4,205,989 | 6/1980 | Moriya et al. | 430/323 |
| 4,247,616 | 1/1981 | Vikesland et al. | 430/192 |
| 4,323,914 | 4/1982 | Berndlmaier et al. | 357/82 |
| 4,329,779 | 5/1982 | England | 29/840 |
| 4,357,395 | 11/1982 | Lifschin et al. | 428/607 |
| 4,366,342 | 12/1982 | Breedlove | 174/52 |
| 4,383,878 | 5/1983 | Young et al. | 156/235 |
| 4,402,998 | 9/1983 | Kumagai et al. | 427/97 |
| 4,426,297 | 1/1981 | Nablo et al. | 427/44 |
| 4,432,723 | 2/1984 | Bouchard | 431/359 |
| 4,443,278 | 4/1984 | Zingher | 156/64 |
| 4,444,848 | 4/1984 | Shanefield et al. | 428/624 |
| 4,455,181 | 6/1984 | Litchin et al. | 156/150 |
| 4,459,320 | 7/1984 | Fefferman | 427/44 |
| 4,465,538 | 8/1984 | Schmoock | 156/234 |
| 4,472,762 | 9/1984 | Spinnelli et al. | 361/386 |
| 4,490,409 | 12/1984 | Nablo | 427/44 |
| 4,584,039 | 4/1986 | Shea | 156/233 |
| 4,615,088 | 10/1986 | Bernard et al. | 29/25.42 |

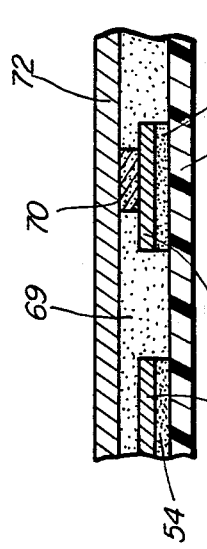
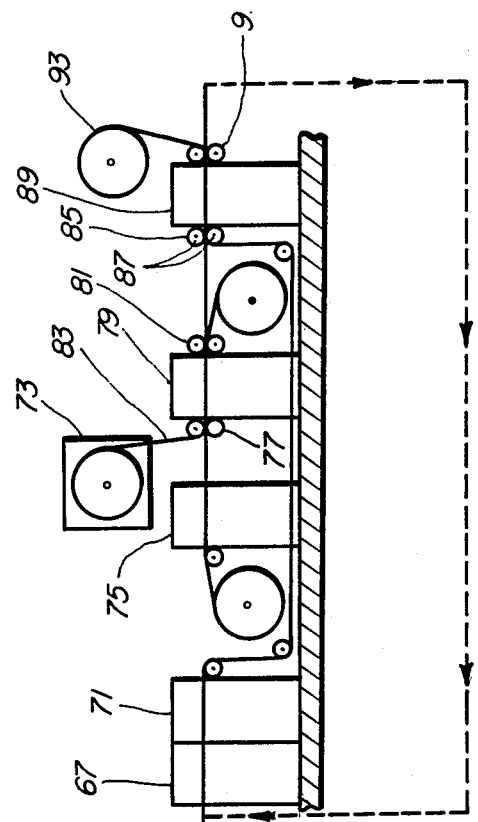
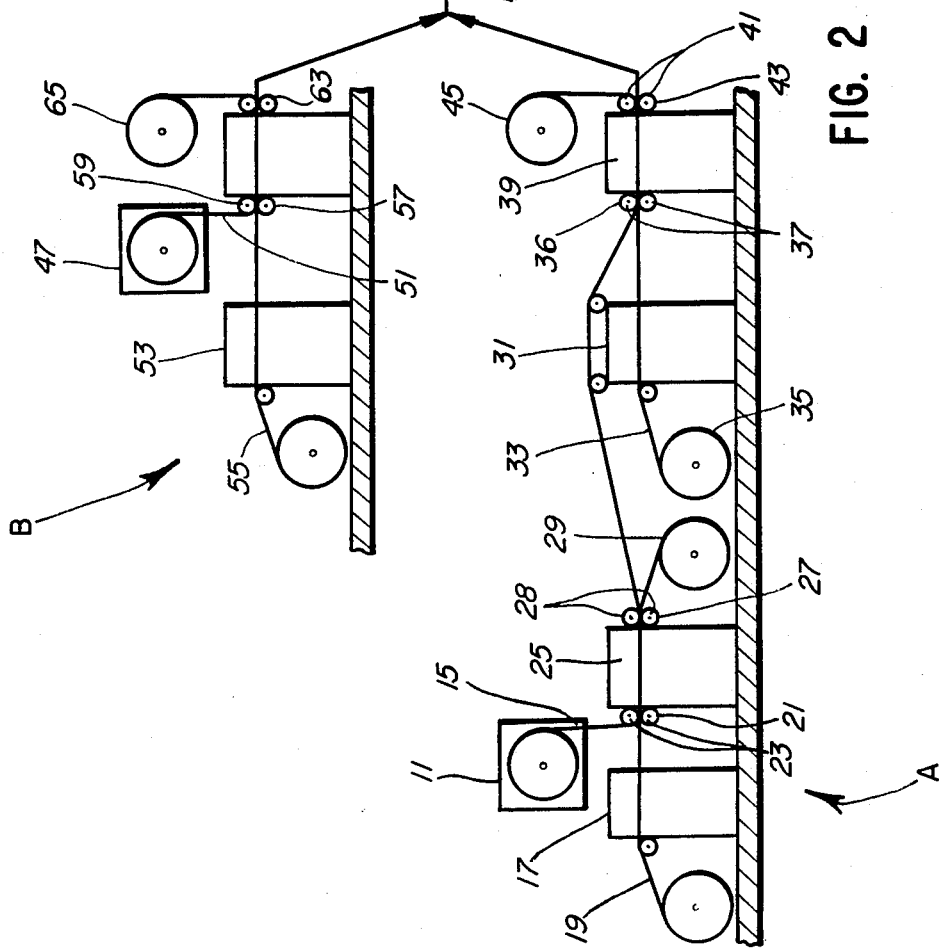

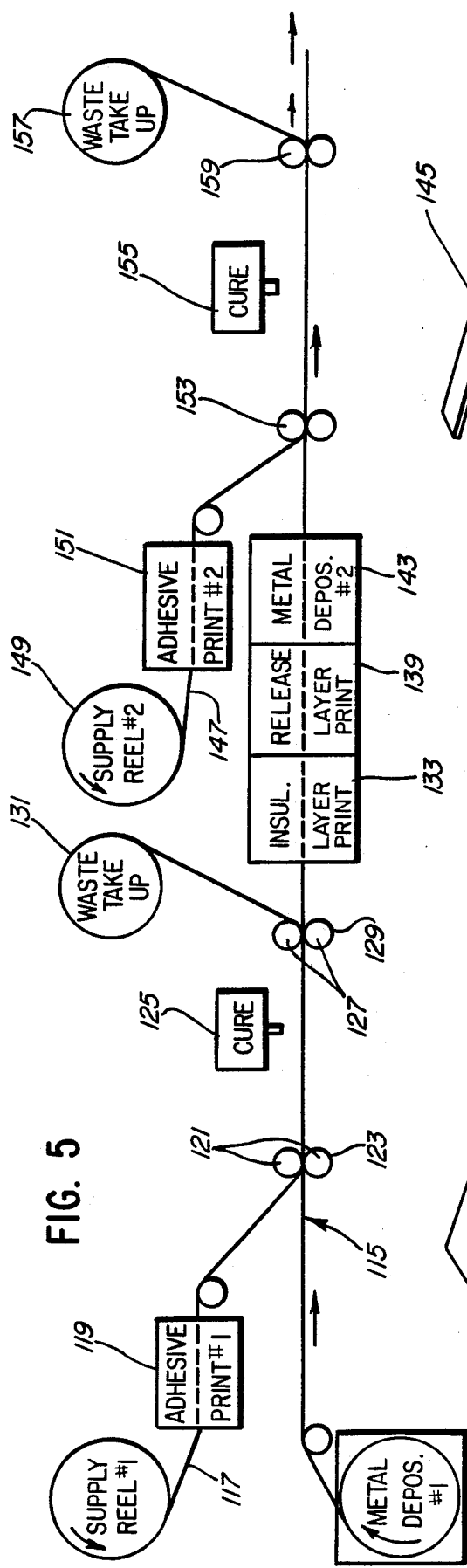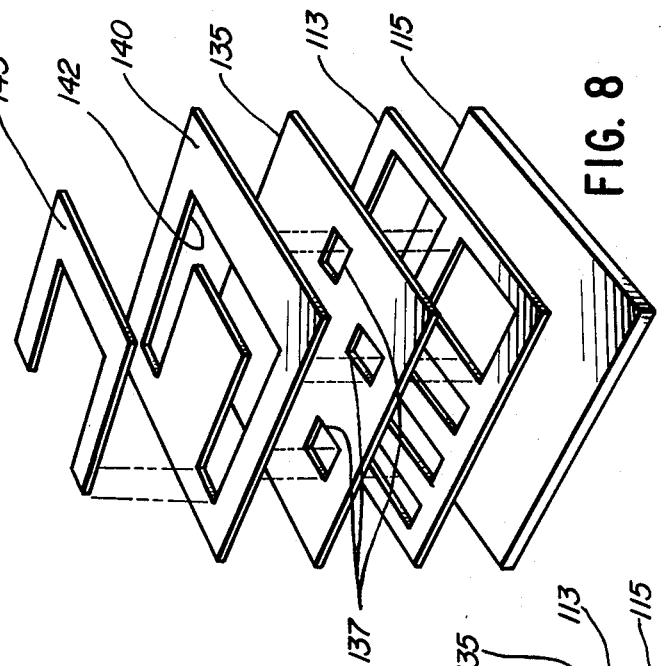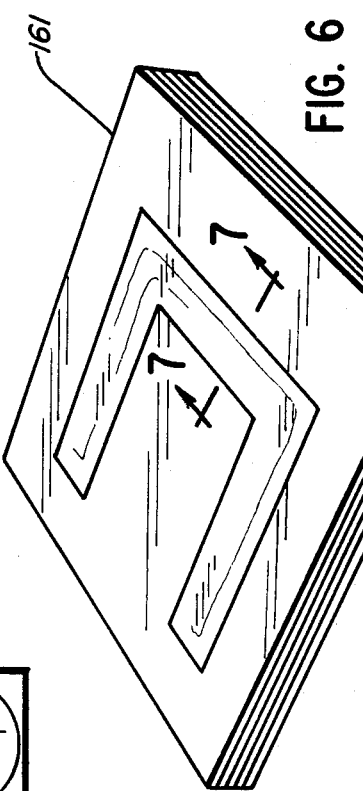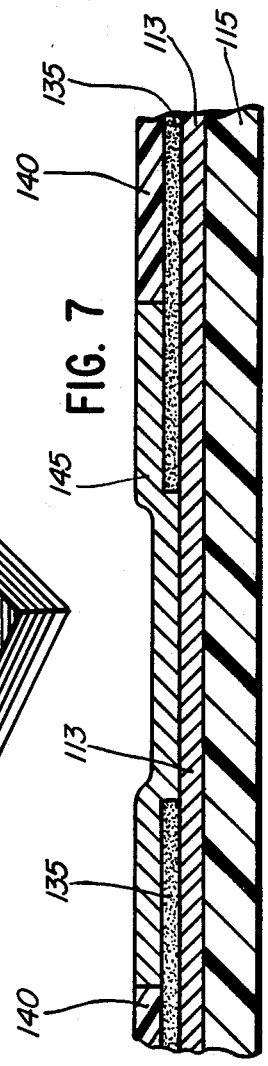

PROCESS FOR PLACING SINGLE OR MULTIPLE PATTERNED LAYERS OF CONDUCTIVE MATERIAL ON A SUBSTRATE

This application is a continuation, of application Ser. No. 730,375, filed May 3, 1985, now abandoned.

BACKGROUND OF THE INVENTION

1. Field Of The Invention

The present invention relates generally to transfer metallization of various substrates and more specifically to the creation of electrically conductive and semi-conductive patterns through transfer metallization techniques.

2. Description Of The Prior Art

The manufacture of various electronic devices such as printed circuit boards or the like requires the placement of patterned layers of conductive material on a substrate. The method of placement must be suitable for high production rates and it must produce precise patterns. These requirements have become increasingly important with the recently developed surface mounting procedures used to mount components to a substrate.

One prior art method is the process of etching copper-clad laminates in accordance with standard negative photo-resist procedures. This process is slow, costly, and produces polluting and hazardous waste materials.

Another prior art method is the process of applying a pattern of conductive ink or paste directly onto the surface of a non-conductive substrate and then curing it. The curing operation of some conductive pastes comprises evaporating volatile solvents. During extended evaporation periods, these solvents may damage the surfaces of thermoplastic substrates with which they come into contact. In addition, once they have evaporated, these solvents become pollutants, requiring costly cleanup.

The use of conductive ink also presents a number of additional problems. One type of ink requires heating to an elevated temperature before it becomes conductive. As a result, its use is limited to substrates such as those made from ceramics which can withstand extreme temperatures. Another type of ink includes epoxy resin, which is unsuitable for high speed, mass production because of long cure times.

The methods used to apply the conductive ink to a substrate also present a variety of problems. In using screens to apply a pattern of ink, the screens become clogged, resulting in incomplete patterns. In addition, the need for regularly cleaning the screen makes the screening process unsuitable for high production rates.

Another known method uses a radiation curable ink containing particles of electrically conductive metal and radiation curable organic resins. This ink cures rapidly, resulting in higher production rates. However, the metal particles in it must have a certain predetermined shape for the ink to cure satisfactorily.

Finally, in placing multiple layers of patterned conductive material using the methods described above, production rates decrease substantially. This decrease occurs partly because of the added step of electrically interconnecting the conductive arrays comprising the various conductive layers. A conventional method of interconnecting the conductive layers of multilayer printed circuit boards and the like consists of forming a hole through the conductive layers and plating the walls of the hole with an electrically conductive material. The plating connects the exposed edges of the conductive layers. This operation consumes considerable time.

The present invention consists of a process which places patterned conductive layers of material on a substrate and which avoids the problems of the methods described above. It is simple, and suitable for high production rates. It does not require the use of special and expensive substrates or conductive inks. Thus, it provides a substantial reduction in the cost of manufacture of printed circuit boards and of various other electrical devices relying on single or multiple layers of conductive and non-conductive materials.

SUMMARY OF THE INVENTION

Accordingly, it is a general object of the present invention to provide an improved process for placing or depositing single or multiple patterned levels of conductive material on a substrate.

It is an object of this invention to provide a process which greatly reduces the cost of manufacture of various electronic components.

It is another object of the present invention to provide a process which is suitable for high production rates.

It is yet another object of this invention to provide a process which does not produce hazardous and polluting waste products.

It is a further object of the present invention to provide a process which places single or multiple patterned levels of conductive material on a substrate without using destructive baking operations or expensive substrates, conductive pastes, or conductive inks.

It is a still further object of this invention to provide a process which produces multilayer printed circuit boards or other multilayer electrical components such as coils having electrical connections between the various conductive levels without the use of plated through holes or unreliable connecting devices.

Other objects and advantages of the invention will become apparent upon reading the following detailed description and appended claims and upon reference to the accompanying drawings.

These objects are achieved by the improved process of the present invention as well as by the printed circuit boards and other components which this process produces. The process of the present invention includes depositing or placing a thin, patterned layer of electrically conductive or semi-conductive material on a substrate. Various procedures can provide this first conductive pattern.

One procedure includes placing a continuous conductive layer on the surface of a transfer agent. The next step comprises printing a pattern of adhesive on the surface of a waste removing agent. By joining and separating the transfer and waste removing agents, the adhesive printed on the waste removing agent peels a portion of the conductive layer off of the transfer agent. The pattern of the portion removed has the same configuration as the pattern of the adhesive. The conductive pattern remaining on the transfer agent is the negative of the adhesive pattern. The next step includes printing a layer of adhesive on the substrate which serves as the base of the device produced. Finally, by joining and separating the substrate and the transfer agent, the adhesive printed on the substrate peels the conductive pattern off of the transfer agent. The adhesive also binds this conductive pattern to the substrate.

A second procedure includes printing a pattern of adhesive on the substrate which serves as the base of the device produced. It also includes depositing a continuous conductive layer on the surface of a transfer agent. By joining and separating the substrate and the transfer agent, the adhesive on the substrate peels off a conductive pattern. The adhesive binds this pattern to the substrate, and the pattern becomes the first conductive pattern.

A third procedure includes placing a continuous layer of conductive material on the substrate so that it mechanically adheres to the substrate. The substrate serves as the base of the device produced. The next step of this procedure consists of printing a pattern of adhesive on the surface of a waste removing agent. By joining and separating the substrate and the waste removing agent, the adhesive on the waste removing agent peels off a portion of the conductive layer. The pattern of the portion removed has the same configuration as the pattern of the adhesive. The conductive pattern remaining on the substrate is the negative of the adhesive pattern.

The process of the present invention also includes various secondary procedures for placing one or more conductive patterns on top of the first. These secondary procedures also electrically interconnect the conductive patterns. The secondary procedures differ, depending on the procedure used to deposit the first conductive pattern. With the first and second procedures outlined above, the secondary procedure used to place the second layer includes printing an insulating adhesive layer on the substrate. The adhesive layer has voids in areas where the second conductive pattern electrically interconnects with the first. The next step of this secondary procedure comprises printing an electrically conductive agent in the voids of the adhesive layer. Finally, this secondary procedure places or deposits the next conductive pattern on the substrate using the first or second procedure outlined above.

With the third procedure, the secondary procedure used to place the second layer includes printing an insulating layer on the substrate. When using an insulating layer that does not allow peeling off of a subsequent conductive layer deposited on it, the secondary procedure includes printing a layer of release agent on top of the insulating layer. The insulating and release layers have voids through which the next conductive pattern electrically interconnects with the first. This secondary procedure also includes using the third procedure again to add a second conductive pattern.

The multilayer circuit board produced by the method of the present invention includes a substrate with a plurality of conductive layers. Insulating layers separate the conductive layers. The conductive layers interconnect through voids in the insulating layers.

BRIEF DESCRIPTION OF THE DRAWINGS

For a more complete understanding of this invention, one should now refer to the embodiment illustrated in greater detail in the accompanying drawings and described below by way of an example of the invention. In the drawings:

FIG. 2 is a side elevational view of the production line showing apparatus for use in the process outlined in FIG. 1.

FIG. 3A is a sectional view of a printed circuit board produced by the procedure labeled A in FIGS. 1A and 2.

FIG. 3B is a sectional view of a printed circuit board produced by the procedure labeled B in FIGS. 1A and 2.

FIG. 5 is a side elevational view of the production line showing apparatus for use in the process of FIG. 4.

FIG. 6 is a perspective view of a multilayer circuit board produced by the process of the alternative embodiment of this invention.

FIG. 7 is a sectional view taken along line 7—7 in FIG. 6.

FIG. 8 is an exploded view of the multilayer circuit board of FIGS. 6 and 7, showing each layer separately.

While the following description discloses the invention in connection with two embodiments, one should understand that the invention is not limited to these embodiments. Furthermore, one should understand that the drawings are not necessarily to scale. Specifically, FIGS. 3A, 3B, 6, 7 and 8 show printed circuit boards produced by the process of the present invention which consists of overlapping levels of various materials. The thickness of the layers represented are not necessarily drawn to scale. These figures are not intended to show the relative thickness of these levels. They are merely intended to facilitate an understanding of the relative position of each component of the circuit boards.

DETAILED DESCRIPTION OF THE DRAWINGS AND THE PREFERRED EMBODIMENTS

Figure 1A:
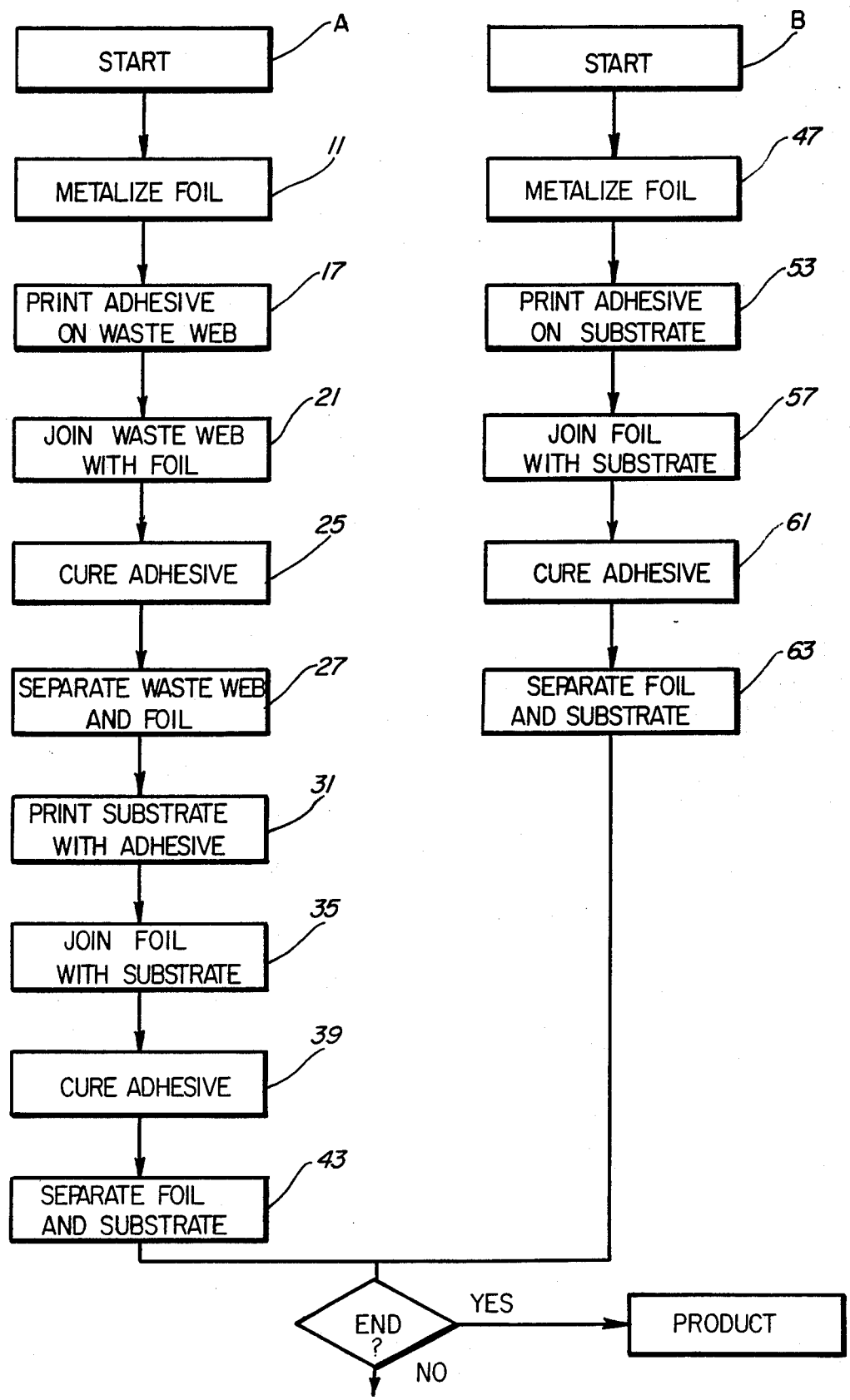
FIGS. 1A and 1B are a flow diagram of the process of placing single or multiple patterned layers of conductive material on a substrate in accordance with the preferred embodiment of the present invention.
Figure 1B:
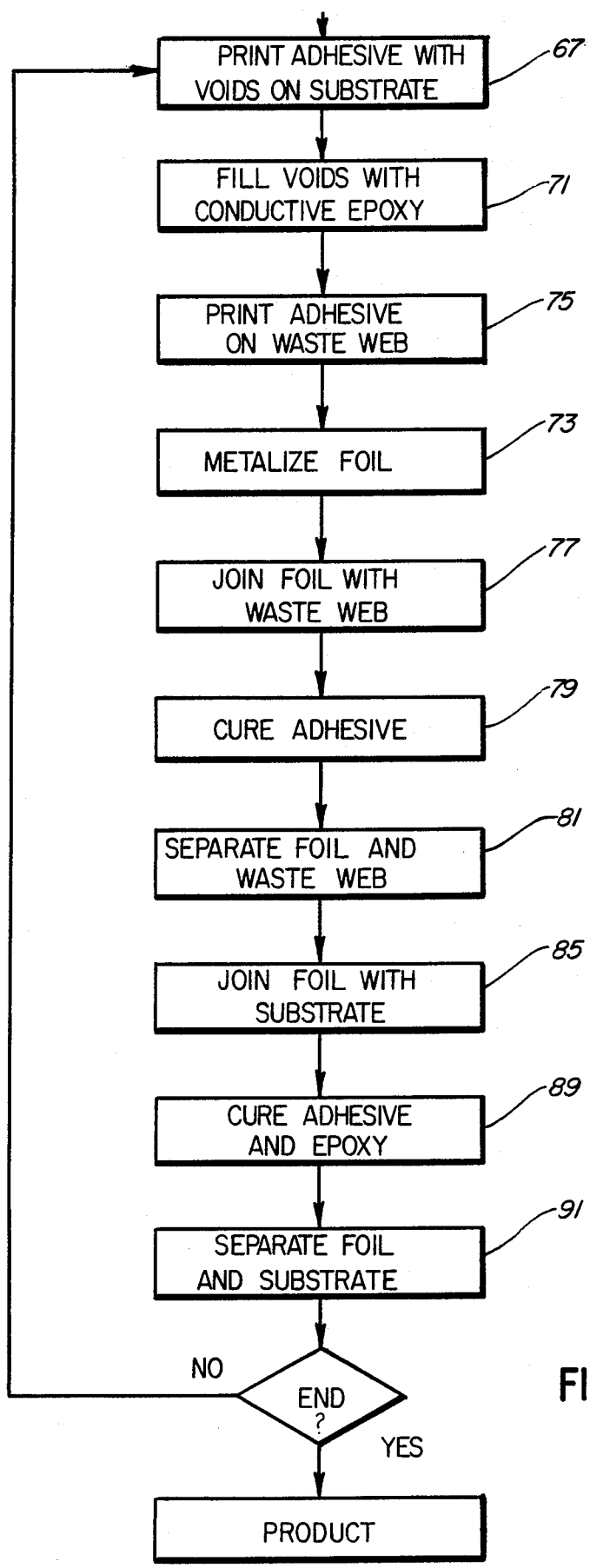

The flow diagram shown in FIGS. 1A and 1B and the production line shown in FIG. 2 illustrate the conductive pattern or array placing process of the present invention. The following description discloses the process used to construct a printed circuit board. However, it has been found that this process can produce other electronic devices or components. Typically, these other devices include devices made through the use of laminates or printed substrates in which insulative layers combine with conductive or semi-conductive materials. Such devices include, for example, coils, antennas, wave guides, printed interdigitized switches, filters, wire, inductors, and capacitors. This process can also produce devices with variable resistance characteristics through the use of thin layers of particles on flexible substrates.

As shown in FIGS. 1A, 1B and 2, the process includes placing or depositing a thin, uniform and releasable layer of electrically conductive particles 13, on a base web to form a foil 15 shown at 11. Thus, the foil 15 comprises the base web and the conductive layer 13. The base web serves as a transfer agent to transfer the conductive layer deposited and formed on it. Metals such as copper, gold, silver and aluminum are suitable conductive materials for forming the conductive layer. The layer deposited is continuous, and it ultimately serves as the first conductive level of the printed circuit board. The particles deposited accumulate to a layer that may range in thickness, depending upon the current carrying qualities of the circuit. However, the process can provide layers which are several orders of magnitude thinner than those of conventional printed circuit boards. Conventional printed circuit boards have conductive layers with thicknesses in the order of 1 mil (0.001 inches) or greater. Thicker conductive layers 13 can be achieved, of course, which have lower resistance and greater current carrying capabilities. In any event, the layer of conductive particles 13 does not exhibit any noticeable tear-resistant characteristics. Therefore, in removing a portion of this layer to form the conductive pattern, as described below, the removed portions do not disrupt the remaining pattern by sticking to it and pulling it away.

The procedure used to place or deposit the conductive layer of particles 13 is any one of a number of known procedures for mechanically adhering particles to a surface. One such known procedure is the vacuum deposition process in which a vacuum condenses vaporized metal onto a suitable base surface.

The base web is a suitable substantially stretch-free material which does not distort the patterned conductive layer formed on its surface as described below. Some examples of suitable materials include polyester, polypropylene, polyethylene and other polyolefins.

As stated above, the base web undergoes the step of metallic deposition to form the foil 15. A conventional printing apparatus at 17, prints a pattern of adhesive onto a second web of material 19. This second web serves as a waste receiving agent. It receives and removes portions of the foils conductive layer using the adhesive printed on it. After serving this function, the second web becomes waste material for disposal. A suitable material for the second web 19 is inexpensive paper stock.

High quality offset lithography is a very high resolution printing process, and thus, is a suitable method for printing the adhesive. Examples of suitable adhesives include rapid curing, radiation-curable adhesive or pressure sensitive adhesive which does not require curing. Like the base web used to make the foil 15, the second web 19 is substantially stretch-free so that it does not distort the adhesive pattern printed on it. This pattern is the negative of the pattern of conductive material that remains on the foil 15. It represents the voids of the conductive layer pattern remaining on the foil.

Guide rollers or similar means advance the printed second web 19 and the foil 15 towards the right along the production line shown in FIG. 2. At 21 pressure rolls 23 join them together so that the adhesive printed surface of the second web 19 contacts the metallized surface of the foil 15.

When using radiation-curable or similar adhesive, the production line includes curing apparatus at station 25. This apparatus cures the adhesive through either the second web 19 or the foil 15. When using untraviolet-curable adhesive the apparatus used is conventional U.V. discharge lamps suitably ballasted to achieve the desired degree of intensity. The web through which the curing apparatus cures the adhesive is transparent to allow the ultraviolet radiation to pass through and reach the adhesive.

When using electron beam-curable adhesive, the apparatus used is one similar to the electron processor described in U.S. Pat. No. 4,246,297 to Nablo et al.. This processor emits a beam of low power, energetic electrons. The electrons have sufficient energy to permeate the web and pass through to cure the adhesive.

When using pressure sensitive adhesive, the curing step is not necessary, since this type of adhesive does not require curing.

The adhesive securely binds the portion of the conductive layer 13, which it contacts, to the second web 19. At 27, the foil 15 and the second web 19 separate as they advance through guide rolls 28. A reel 29 receives and collects the second web 19 for disposal. Guide roll apparatus advance the foil 15 down the production line. The second web 19 takes a portion of the conductive layer 13 with it. It peels this portion off the foil 15. The portion of the conductive layer remaining on the foil 15 forms the first conductive pattern or array.

At station 31, a printing apparatus prints a layer of adhesive 32 on a substrate 33 supplied by a reel 35. Examples of suitable adhesives include radiation-curable and pressure sensitive adhesives. Although the substrate 33 is an elongate web here, cutting and slitting operations later form it into the desired peripheral configuration. The printing apparatus prints the adhesive so that it fully covers the area within this peripheral configuration. Since this layer of adhesive 32 serves as an insulating layer as well as a binder, the substrate 33 may be either electrically conductive or non-conductive. Examples of suitable substrate materials include conductive metal film and non-conductive polyester film, paper, plastic, or fiberglass. The substrate 33 has a thickness which allows it to pass through the conventional printing apparatus described above.

Guide means bring the substrate 33 and foil 15 together at station 35 where pressure rolls 37 laminate the two together. Here, the adhesive printed surface of the substrate 33 contacts the partially metallized surface of the foil 15. Together the foil and the substrate advance down the production line from the laminating station 35 to a curing station 39. At station 39, an appropriate curing apparatus cures the adhesive, if the adhesive is of the type that requires curing.

The cured adhesive securely binds the portion of the conductive layer 13 remaining on the foil 15 to the substrate 33. This bond is stronger than the bond between the conductive layer 13 and the base web of the foil 15. Thus, when the foil 15 and the substrate 33 separate, the first conductive pattern peels off the foil 15 and remains on the substrate 33. The foil 15 and the substrate 33 together move past the guide rolls 41 at 43. Reel 45 receives and collects the base web of the foil 15; and the base web of the foil 15 separates from the substrate 33.

The process at this point produces a single layer printed circuit board. FIGS. 1A, 1B and 2 also show an alternate procedure for making this single layer board. This alternative procedure includes placing or depositing a thin, uniform, and releasable layer of electrically conductive particles 49 on a substantially stretch-free base web to form a foil 51 shown at 47. This step is identical to the step performed to produce the foil 15 shown at 11. Additionally, the base web here performs the same function as the base web of foil 15. It serves as a transfer agent to transfer the conductive layer deposited on it to a substrate.

A printing apparatus of the type generally described above prints a pattern of adhesive 54 onto a substrate 55 at station 53. This substrate serves as the base of the circuit board. The adhesive 54 binds the first conductive pattern to the substrate. It also insulates and separates the first conductive pattern from the substrate. The pattern of the adhesive is the positive of the first conductive pattern. As shown below, the first conductive pattern or layer 49 overlaps the adhesive layer 54. It also has the same peripheral configuration as the adhesive layer. This increases the risk of electrical contact between the conductive layer 49 and the substrate 55. Therefore, the substrate 55 is electrically nonconductive and made from a material such as polyester. However, a conductive substrate coated with an insulating cover is also a suitable alternative.

At station 57, the pressure rolls 59 join the foil 51 and the substrate 55. The pattern of adhesive 54 contacts the conductive layer 49. While the foil 51 and substrate 55 remain joined together, curing apparatus at station 61 cures the adhesive, if the adhesive requires curing. At station 63, the foil 51 separates from the substrate 55, leaving the first conductive array or first patterned layer of electrically conductive circuitry on the substrate. A reel 65 collects the foil 51. The waste portion of the conductive layer 49 remains on the foil 51, obviating the need for a waste removing agent such as the second web 19 used in the procedure described above.

To make a multilayer circuit board, the process continues as shown in FIGS. 1B and 2. The substrate with the first layer of conductive material moves down the production line to a printing station at 67. The printing apparatus prints a layer of adhesive 69 on the substrate 33 or 55 to fully cover the substrate and the first conductive pattern or layer. However, it leaves voids in the adhesive layer through which the second patterned layer of conductive circuitry makes electrical contact with the first. The adhesive layer 69 serves to insulate the first conductive layer from the second, to bind the second conductive layer to the substrate, and to protect the first conductive layer.

At the next station 71, printing apparatus prints conductive epoxy 70 to fill the voids of the adhesive layer 69. This epoxy makes the electrical contact between the first and second conductive layers. Suitable epoxies are EB-Curable Conductive Epoxy 4003 and 5002 manufactured by Electro-Kinetic Systems, Inc., Aston, Pa.

Alternatively, rather than printing epoxy to fill the voids, the printing step at 67 may provide full coverage of adhesive. Then, to provide an electrical contact, the process may impregnate conductive particles in the adhesive at desired, localized areas.

To form the second conductive layer 72, the process further includes the steps previously performed at 11, 17, 21, 25 and 27. FIG. 2 shows these steps at A. The process now performs these steps at 73, 75, 77, 79 and 81, respectively. These steps form the second conductive layer 72 on foil 83.

Alternatively, the process may include the procedure labeled B in FIG. 2 to place the second conductive layer. However, in using this procedure, the printing apparatus at 67 does not print the adhesive 69 to fully cover the substrate. It prints a pattern of adhesive. This pattern is the positive of the pattern of the second conductive layer 72.

At station 85, the pressure rolls 87 laminate the foil 83 to the substrate 33 or 55. At station 89, curing apparatus cure the adhesive 69 and the epoxy 70. These two steps bind the second conductive layer to the substrate and allow it to make electrical contact, through the conductive epoxy, with the first conductive layer. At station 91, the foil 83 and the substrate separate. Upon separation, a reel 93 collects the re-usable base web of foil 83.

As an alternative to printing the epoxy 70 at station 71, the process may perform this operation after station 91. This alternative would avoid printing the epoxy before curing the adhesive 69. Here, the epoxy extends between the top of the first conductive layer to the top of the second conductive layer. This alternative also requires another curing step after the printing of the epoxy.

At this point in the production line, station 91, the process has provided either the two-layer printed circuit board shown in FIG. 3A or the one shown in FIG. 3B. Starting with the printing step at station 67 and repeating the steps that follow, the process can add another conductive pattern. This process can continue to add as many layers as desired.

The multilayer printed circuit board shown in FIG. 3A includes a substrate 33 covered by a layer of adhesive 32. This layer of adhesive 32 supports the first conductive pattern 13. The layer of adhesive 69 covers the substrate, and it includes voids filled with conductive epoxy 70. The adhesive 69 and the epoxy 70 support the next conductive layer 72. The adhesive 69 and epoxy 70 also bind this next layer to the substrate.

The multilayer printed circuit board shown in FIG. 3B includes a substrate 55. The substrate supports a pattern of adhesive 54. This adhesive binds the first conductive layer 49, which overlaps the adhesive pattern, to the substrate 55. The layer of adhesive 69 covers the substrate, and it includes voids filled with conductive epoxy 70. As in the printed circuit board shown in FIG. 3A, the adhesive 69 and epoxy 70 support the next conductive layer 72. The adhesive 69 and epoxy 70 also bind this next layer to the substrate.

FIGS. 4 through 8 illustrate an alternative embodiment of the conductive pattern or array placing process of the present invention. The flow diagram shown in FIG. 4 and the production line shown in FIG. 5 illustrate this alternative embodiment of the process of the present invention. As shown, the process includes depositing at 111 a thin layer of electrically conductive particles 113 on a substrate 115. The procedure used to deposit the particles is a known procedure such as vacuum metallization.

The substrate 115 is a web of non-conductive material, e.g., a polyolefin such as polypropylene or polyester. It has a thickness which allows it to pass through conventional printing apparatus. The conductive layer deposited has the same characteristic as the conductive layers of the foils of the embodiment disclosed above.

A conventional printing apparatus prints a pattern of adhesive onto a waste receiving agent or web 117 at 119. High quality offset lithography is a suitable method for printing the adhesive. The pattern printed on the waste web is the negative of the pattern of conductive material which ultimately remains on the substrate. It represents the voids of the pattern of conductive material remaining on the substrate. Radiation-curable adhesives cure rapidly. Thus, one skilled in the art may use any one of a number of ultraviolet or electron beam curable adhesives. However, pressure sensitive adhesive which does not require any curing is also a suitable alternative. The web 117 receives and removes a portion of the conductive layer 113. After serving this function, the web 117 becomes waste material for disposal. The web 117 is substantially stretch-free and does not distort the adhesive pattern printed on it.

Guide rollers or similar means advance the printed web 117 towards the right along the production line shown in FIG. 5. A conveyor belt or other similar mechanism conveys the metallized substrate 115 in the same direction. Moving individually down the production line, the web 117 and the substrate 115 reach a point at 123 where pressure rolls 121 join them together. The printed surface of the web 117 contacts the metallized surface of the substrate 115.

Together the web and substrate move down the production line from the laminating station 123 to a curing station at 125. The curing apparatus overhangs the web substrate assembly and it cures the adhesive through the web 117. When using pressure sensitive adhesive, this curing step is not necessary. When using radiation curable adhesives, the requisite apparatus described above cures the adhesive. It cures it through the web 117 which is a material which allows the particular radiation used to pass through it.

The adhesive securely binds the portion of the conductive layer 113, which it contacts, to the web 117. This bond is stronger than the bond between the conductive layer 113 and the substrate 115. Thus, when the waste web 117 and the substrate 115 separate, the waste web 117 removes the portion of the conductive layer 113 which the adhesive contacts. The waste web 117 and the substrate 115 advance past the two guide rolls 127 through a nip between the rolls at 129. A reel 131 receives and collects the waste web 117. The web 117 separates from the substrate 115, taking a portion of the conductive layer with it and leaving a pattern of voids in the conductive layer. The remaining conductive material is the conductive pattern of the printed circuit board.

Figure 4:
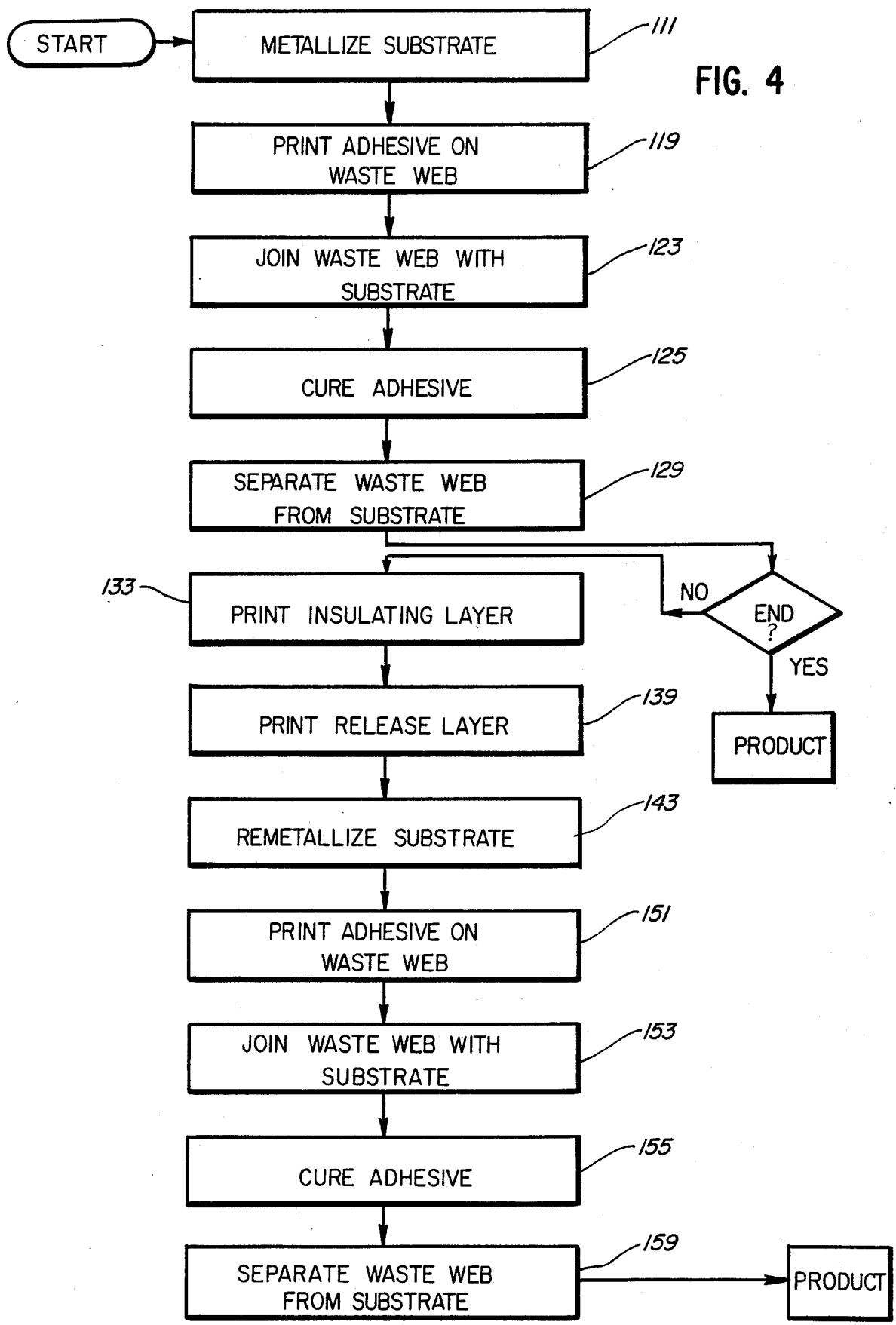
FIG. 4 is a flow diagram of the process of placing single or multiple patterned layers of conductive material on a substrate in accordance with an alternative embodiment of the present invention.

Up to this point the process produces a single layer printed circuit board. To make a multilayer circuit board, the process continues, as shown in FIGS. 4 and 5. The substrate 115 with the first layer of conductive pattern moves down the production line to a printing station at 133. The printing apparatus prints a layer of insulating material 135 on the substrate and over the first conductive layer. (See FIGS. 7 and 8). The printing process is a high quality, high resolution process, e.g., offset lithography. Varnish or adhesive which cures quickly serves as an electrically insulating material. The varnish also serves to protect and add strength to the conductive layer that it covers. The insulating layer has openings 137 through which the next conductive layer makes electrical contact with the conductive layer 113.

At the next station 139 in the production line, after the varnish has cured, the printing mechanism prints a layer of release agent 140 on top of the insulating layer 135. The release layer 140 has openings 142 which overlap openings 137 in the insulating layer 135. These openings 142 provide passageways through which the next conductive layer makes electrical contact with the conductive layer 113. They also form a pattern that is the same as the pattern of the next conductive layer. The next conductive layer fills these openings 142. Thus, the insulating layer 135 provides the surface to which the remaining portion of the next conductive layer adheres.

The release layer provides a surface on which the removable portion of the next conductive layer accumulates. The strength of the bond between the release layer and the removable portion of the next conductive layer is weaker than the combined total strength created by the bond between the first conductive layer 113 and the substrate 115 and the strength added by the stiffness of the insulation material 135. Thus, the waste material removal procedure that follows does not pull the first conductive layer 113 and the substrate 115 apart. Suitable release agents include Ebecryl 19-6350, UV-EB curable slip agent, manufactured by Radcure Specialties, Inc., Port Washington, Wis. and Syl-off 23 manufactured by Dow Corning Corp., Midland, Mich.

Alternately, the process may not require the step of printing a release layer, if the insulating layer 135 has the release properties provided by the release layer 140.

The substrate 115 then advances to the second metal depositing station at 143. At station 143, apparatus for any one of a variety of metal depositing techniques known to one skilled in the art deposits a second layer of conductive metal 145 onto the substrate. This second layer 145 extends through openings 142 of the release layer and openings 137 of the varnish layer to make contact with the first conductive layer 113. (See FIG. 7).

A second waste web 147 provided by supply reel 149 has a pattern of adhesive printed on its bottom surface by a printer at 151. The web 147 provides the same function as that provided by web 117. It contacts the conductive layer 145 at laminating station 153. There, the adhesive printed on its bottom surface binds the portion of the conductive layer 145 which it contacts to the waste web 147. The adhesive cures at 155 while the web 147 remains on the substrate 115. A reel 157 takes up and collects the web 147, pulling or peeling it away from the substrate 115 at 159. The remaining portion of the conductive layer 145 forms the second conductive pattern or array of the circuit board.

At this point in the production line, the process provides the two-layer printed circuit board 161 shown in FIG. 6.

Referring to FIG. 7, the multilayer circuit board produced by the alternate embodiment of the process of the present invention includes a substrate 115. The substrate 115 supports the first conductive array 113 disposed on its surface. The insulating layer of varnish 135 covers, protects, and insulates the first conductive pattern 113. The layer of release agent 140 covers the insulating layer in the areas outside of the area covered by the second conductive pattern 145. This second conductive pattern contacts the first pattern through openings 137 in the layer of varnish 135 and openings 142 in the release layer 140. The layer of varnish 135 supports the second conductive pattern 145 and insulates it from the first conductive pattern 113 except at the contact areas 137.

Thus, the above disclosure has provided an improved method for placing a patterned conductive layer on a substrate. This method is suitable for high speed production. It does not require the use of special and expensive substrates or conductive pastes and inks. In addition, it provides unique and reliable electronic devices, including multilayer printed circuit boards. While the disclosure has provided only two embodiments of the invention, one should understand, of course, that the invention is not limited to these embodiments. Those skilled in the art to which the invention pertains may make modifications and other embodiments of the principles of this invention, particularly upon considering the foregoing teachings.

For example, although the two disclosed embodiments show a continuous web process with multiple printing and curing stations, sheet fed or hand fed operations may be used. These operations process the substrate in defined sections, one operation at a time. In addition, the substrate may be rigid or flexible. Furthermore, the embodiments disclosed show the printing of insulating layers between conductive layers. However, in producing chemical batteries the process may substitute the insulating layer with an electrolite. Finally, the embodiments disclosed show the use of irradiating systems for curing operations at a number of locations. One should understand that one irradiating system at one location can perform several or all of the curing steps.

It is, therefore, intended that the appended claims cover any such modifications and other embodiments as incorporate those features which constitute the essential features of this invention.

What is claimed is:

1. A method for making electronic components by placing electrically conductive or semi-conductive patterns on a substrate, comprising the steps of:
   (a) depositing a releasable layer of electrically conductive material on a transfer agent;
   (b) removing a pattern of the conductive layer from said transfer agent to leave a desired remaining pattern of the conductive layer;
   (c) transferring said desired remaining pattern to a substrate to establish electrical current paths across said substrate;
   (d) applying an insulating separating layer of material on the pattern on said substrate;
   (e) repeating steps (a) and (b); and
   (f) transferring said desired remaining pattern resulting form step (e) to the resultant of step (d) to establish electrical current paths thereacross.

2. A method for making electronic components by placing electrically conductive or semi-conductive patterns on a substrate, comprising the steps of:
   (a) depositing a releasable layer of electrically conductive material on a transfer agent;
   (b) removing a pattern of the conductive layer form the transfer agent to leave a desired remaining pattern on the transfer agent;
   (c) transferring said desired pattern of said conductive layer from said transfer agent to a substrate to establish electrical current paths across said substrate;
   (d) applying an insulating separating layer of material on the pattern on said substrate which is the same or different from the pattern of step (b);
   (e) depositing a releasable layer of electrically conductive material on a transfer agent;
   (f) removing a pattern of the conductive layer deposited in step (e) from said transfer agent to leave a desired remaining pattern of the conductive layer, said desired remaining pattern of the conductive layer being either the same or different from the pattern of step (b);
   (g) transferring said desired remaining pattern resulting from step (f) to the resultant of step (d); and
   (h) repeating steps (d) through (g) as desired, each time building on the resultant of the previous step.

3. A method for making electronic components by placing electrically conductive or semi-conductive patterns on a substrate, comprising the steps of:
   (a) depositing a releasable layer of electrically conductive material on a substrate;
   (b) removing a pattern of the conductive layer from said substrate to leave a desired remaining pattern on said substrate and establish electrical current paths across said substrate;
   (c) applying an insulating separating layer of material on said substrate which is the same or different from the pattern of step (b);
   (d) depositing a releasable layer of electrically conductive material on the resultant of step (c); and
   (e) removing a pattern of the conductive layer deposited in step (d) to leave a desired remaining pattern of the conductive layer.

4. A method for making electronic components by placing electrically conductive and semi-conductive patterns on a substrate, comprising the steps of:
   (a) depositing a releasable layer of electrically conductive material on a transfer agent;
   (b) applying an adhesive on a waste removing agent to a desired pattern;
   (c) joining said waste removing agent and said transfer agent so that said adhesive on said waste removing agent contacts a portion of the conductive layer on said transfer agent and binds the portion to said water removing agent;
   (d) separating said waste removing agent and said transfer agent to remove a pattern of the conductive layer with the waste removing agent and to leave a desired remaining pattern of the conductive layer on the transfer agent, the removed pattern having the same configuration as the adhesive pattern, the remaining pattern being the negative of said adhesive pattern;
   (e) applying an adhesive on a substrate;
   (f) joining said transfer agent and said substrate so that said adhesive on said substrate contacts the remaining conductive pattern on said transfer agent and binds the remaining conductive pattern to said substrate; and
   (g) separating said transfer agent and said substrate to leave the remaining conductive pattern on said substrate and establish electrical current paths across said substrate.

5. The method of claim 4, further comprising the step of curing the adhesive applied in step (b) while said waste removing agent remains joined with said transfer agent.

6. The method of claim 4, further comprising the step of curing the adhesive applied in step (e) while said transfer agent remains joined with said substrate.

7. The method of claim 4 wherein step (e) provides full coverage of adhesive to the surface of the substrate.

8. A method for making electronic components by placing electrically conductive and semi-conductive patterns on a substrate, comprising the steps of:
   (a) depositing a releasable layer of electrically conductive material on a transfer agent;
   (b) applying an adhesive on a substrate to a desired pattern;
   (c) joining said transfer agent and said substrate so that said adhesive on said substrate contacts a portion of the conductive layer on said transfer agent and binds the portion to said substrate; and
   (d) separating said transfer agent and said substrate to remove a pattern of conductive layer from the transfer agent and transfer said removed pattern to said substrate where said removed pattern provides an electrical current path, said removed conductive pattern having the same peripheral configuration as the adhesive pattern.

9. The method of claim 8, further comprising the step of curing the adhesive applied in step (b) while said transfer agent remains joined with said substrate.

10. A method for making electronic components by placing electrically conductive and semi-conductive patterns on a substrate, comprising the steps of:

(a) depositing a releasable layer of electrically conductive material on a transfer agent;

(b) applying an adhesive on a waste removing agent to a desired pattern;

(c) joining the waste removing agent and said transfer agent so that said adhesive on said waste removing agent contacts a portion of the conductive layer on said transfer agent and binds the portion to said waste removing agent;

(d) separating said waste removing agent and said transfer agent to remove a pattern of the conductive layer with the waste removing agent and to leave a desired remaining pattern of the conductive layer on the transfer agent, the removed pattern having the same configuration as the adhesive pattern, the remaining pattern being the negative of said adhesive pattern;

(e) applying an adhesive on a substrate;

(f) joining said transfer agent and said substrate so that said adhesive on said substrate contacts the remaining conductive pattern on said transfer agent and binds the remaining conductive pattern to said substrate;

(g) separating said transfer agent and said substrate to leave the remaining conductive pattern on said substrate and establish electrical current paths across said substrate;

(h) applying a layer of adhesive over said remaining conductive pattern on said substrate, said adhesive layer having at least one void and providing electrical insulation for said remaining conductive pattern;

(i) applying an electrically conductive interconnecting agent in the void of the layer of adhesive applied in step (h);

(j) repeating steps (a) through (d);

(k) joining the transfer agent of step (j) and said substrate so that the adhesive applied on said substrate in step (h) contacts the conductive pattern on said transfer agent of step (j) and binds said conductive pattern to said substrate so that the conductive pattern makes electrical contact with the electrically conductive interconnecting agent; and (l) repeating steps (h) through (k) to provide the desired number of conductive layers which form electric paths.

11. A method for making electronic components by placing electrically conductive and semi-conductive patterns on a substrate, comprising the steps of:

(a) depositing a releasable layer of electrically conductive material on a transfer agent;

(b) applying an adhesive on a substrate to a desired pattern;

(c) joining said transfer agent and said substrate so that said adhesive on said substrate contacts a portion of the conductive layer on said transfer agent and binds the portion to said substrate;

(d) separating said transfer agent and said substrate to remove a pattern of conductive layer from the transfer agent and transfer said removed pattern to said substrate where said removed pattern provides electrical current paths, said removed conductive pattern having the same peripheral configurations as the adhesive pattern;

(e) applying a layer of adhesive over the removed conductive pattern on said substrate, said adhesive layer having at least one void and providing electrical insulation for said removed conductive pattern;

(f) applying an electrically conductive interconnecting agent in the void of the layer of adhesive applied in step (e);

(g) depositing a releasable layer of electrically conductive material on a second transfer agent;

(h) applying an adhesive on a waste removing agent to a desired pattern;

(i) joining said waste removing agent and said second transfer agent so that said adhesive on said waste removing agent contacts a portion of the conductive layer on said second transfer agent and binds the portion to said waste removing agent;

(j) separating said waste removing agent and said second transfer agent to remove a pattern of the conductive layer with the waste removing agent and to leave a desired remaining pattern of the conductive layer on the transfer agent, the removed pattern having the same configuration as the adhesive pattern, the remaining pattern being the negative of said adhesive pattern;

(k) joining the second transfer agent and said substrate so that the adhesive applied on said substrate in step (e) contacts the remaining conductive pattern on said second transfer agent and binds said pattern to said substrate so that the remaining conductive pattern makes electrical contact with the electrically conductive interconnecting agent of step (f); and (l) repeating steps (e) through (k) to provide the desired number of conductive layers which form electric paths.

12. A method for making electronic components by placing electrically conductive and semi-conductive patterns on a substrate, comprising the steps of:

(a) depositing a releasable layer of electrically conductive material on a substrate;

(b) applying an adhesive on a waste removing agent to a desired pattern;

(c) joining said waste removing agent and said substrate so that said adhesive on said waste removing agent contacts a portion of the conductive layer on said substrate and binds the portion to said waste removing agent; and (d) separating said waste removing agent and said substrate to remove a pattern of the conductive layer and to leave a desired remaining pattern of the conductive layer and establish electrical current paths, said removed pattern having the same configuration as the pattern of adhesive, said remaining pattern of the conductive layer being the negative of said pattern of adhesive.

13. The method of claim 12, further comprising the step of curing said adhesive applied in step (b) while said waste removing agent remains joined with said substrate.

14. A method for making electronic components by placing electrically conductive and semi-conductive patterns on a substrate comprising the steps of:

(a) a depositing a releasable layer of electrically conductive material on a substrate;

(b) applying an adhesive on a waste removing agent to a desired pattern;

(c) joining said waste removing agent and said substrate so that said adhesive on said waste removing agent contacts a portion of the conductive layer on said substrate and binds the portion to said waste removing agent;

(d) separating said waste removing agent and said substrate to remove a pattern of the conductive layer and to leave a desired remaining pattern of the conductive layer and establish electrical current paths, said removed pattern having the same configuration as the pattern of adhesive, said remaining pattern of the conductive layer being the negative of said pattern of adhesive;

(e) applying a layer of insulating material over said desired remaining conductive pattern, said insulating layer having at least one void and providing electrical insulation for the conductive layer which it covers;

(f) applying a layer of release agent over said insulating layer, said release layer having at least one void, said void intersecting the void in said insulating layer;

(g) depositing a second releasable layer of electrically conductive particles on the release layer and on said insulating layer, said second conductive layer making electrical contact with the first conductive layer through the voids in said insulating and release layers; and (h) repeating steps (b) through (d).

* * * * *